United States Patent
Kabasawa (10) Patent No.: US 7,683,616 B2
(45) Date of Patent: Mar. 23, 2010

(54) MAGNETIC RESONANCE IMAGING APPARATUS, MAGNETIC RESONANCE IMAGING METHOD, AND DIFFUSION TENSOR COLOR MAP IMAGE GENERATING APPARATUS

(75) Inventor: Hiroyuki Kabasawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 231 days.

(21) Appl. No.: 11/958,205

(22) Filed: Dec. 17, 2007

(65) Prior Publication Data

US 2008/0157764 A1 Jul. 3, 2008

(30) Foreign Application Priority Data

Dec. 19, 2006 (JP) .............................. 2006-340949

(51) Int. Cl.
G01V 3/00 (2006.01)
(52) U.S. Cl. ....................................... 324/309; 600/410
(58) Field of Classification Search ................. 324/309, 324/307; 600/410
See application file for complete search history.

(56) References Cited

U.S. PATENT DOCUMENTS

| 6,526,305 | B1 | 2/2003 | Mori |
| 6,614,226 | B2* | 9/2003 | Wedeen ...................... 324/309 |
| 6,642,716 | B1* | 11/2003 | Hoogenraad et al. ........ 324/309 |
| 6,853,189 | B1* | 2/2005 | Pipe ........................... 324/307 |
| 6,859,203 | B2* | 2/2005 | van Muiswinkel et al. .. 345/424 |
| 6,992,484 | B2 | 1/2006 | Frank |
| 6,998,841 | B1 | 2/2006 | Tamez-Pena et al. |
| 7,355,597 | B2* | 4/2008 | Laidlaw et al. .............. 345/419 |
| 2005/0101857 | A1 | 5/2005 | Masutani et al. |
| 2008/0109171 | A1* | 5/2008 | McGraw et al. .............. 702/19 |
| 2008/0284434 | A1* | 11/2008 | Wedeen ...................... 324/309 |
| 2009/0118608 | A1* | 5/2009 | Koay .......................... 600/410 |

FOREIGN PATENT DOCUMENTS

| JP | 2004-081657 | 3/2004 |
| JP | 2004-089224 | 3/2004 |

OTHER PUBLICATIONS

Shiggeki Aoki et al., Mechanism of Diffusion MRI, Oct. 1, 2005, 108-109 pgs., Shujun-sha, Japan.

* cited by examiner

Primary Examiner—Louis M Arana
(74) Attorney, Agent, or Firm—Armstrong Teasdale LLP (57) ABSTRACT

A magnetic resonance imaging apparatus for generating an image related to a radiographing area of a subject on the basis of a magnetic resonance signal produced in the radiographing area within a static magnetic field space, the magnetic resonance imaging apparatus includes: a fiber tracking device for tracking a running fiber in the radiographing area on the basis of a diffusion tensor calculated from the magnetic resonance signal; and a diffusion tensor color map image generating device for generating as said image a diffusion tensor color map image so as to match a curved surface including a tract extracted in the fiber tracked by the fiber tracking device, wherein the diffusion tensor color map image generating device generates the diffusion tensor color map image in such a manner that, in the fiber tracked by the fiber tracking device, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

18 Claims, 4 Drawing Sheets

MAGNETIC RESONANCE IMAGING APPARATUS, MAGNETIC RESONANCE IMAGING METHOD, AND DIFFUSION TENSOR COLOR MAP IMAGE GENERATING APPARATUS

BACKGROUND OF THE INVENTION

The present invention relates to a magnetic resonance imaging apparatus, a magnetic resonance imaging method, a diffusion tensor color map image generating apparatus, and a diffusion tensor color map image generating method.

The magnetic resonance imaging (MRI) apparatus is in wide use particularly in medical applications as an apparatus for radiographing tomographic images of a subject with use of a nuclear magnetic resonance (NMR) phenomenon.

In the magnetic resonance imaging apparatus, a radiographing area of a subject is accommodated within a static magnetic field space, thereby aligning proton spins in the radiographing area in the direction of the static magnetic field to generate a magnetization vector. Then, RF pulses of a resonance frequency are emitted to create a nuclear magnetic resonance phenomenon, thereby causing the spins to flip and changing the magnetization vector of the protons. Thereafter, the magnetic resonance imaging apparatus receives a magnetic resonance (MR) signal which is produced when the protons revert to the state of the original magnetization vector, and reconstructs an image such as a slice image related to the radiographing area on the basis of the received magnetic resonance signal.

In the magnetic resonance imaging apparatus, for example in order to obtain information such as one related to a running direction of a fiber such as a nerve fiber, a fiber tracking method is performed in the diffusion tensor method to track the fiber. More particularly, the fiber tracking is conducted by calculating a primary axis direction of a diffusion tensor. Further, in order to grasp the running direction of the fiber, a diffusion tensor color map image is reconstructed with respect to a curved surface along which a tract extracted in the fiber runs, and the reconstructed diffusion tensor color map image is displayed (see, for example, Patent Literatures 1, 2, 3 and Non-Patent Literature 1).

Here there is utilized a phenomenon such that when a fiber such as a nerve fiber and water molecules present around the fiber are diffused in a direction parallel to a running direction of the fiber, the diffusion is not limited, but when the diffusion occurs in a direction different from the fiber running direction, the diffusion is limited by a cell membrane, so that a measured diffusion coefficient of the water molecules becomes high in the portion parallel to the fiber running direction, while it becomes low in the portion not parallel to the running direction. That is, imaging is made as a diffusion tensor color map image by utilizing the anisotropy of the water molecule diffusion.

[Patent Literature 1]. Japanese Unexamined Patent Publication No. 2004-89224.

[Patent Literature 2]. Japanese Unexamined Patent Publication No. 2004-81657.

[Patent Literature 3]. U.S. Pat. No. 6,526,305.

[Non-Patent Literature 1]. Shigeki AOKI, et al., "Mechanism of Diffusion MRI," Shujun-sha.

For generating a diffusion tensor color map image, as described above, scanning is performed in a static magnetic field space for a three-dimensional area including the brain of a subject for example as a radiographing area, thereby acquiring a magnetic resonance signal from the radiographing area.

For example, scanning is performed in the radiographing area which is a three-dimensional area with respect to both the case where MPG (Motion Probing Gradient) is applied in plural directions and the case where MPG is not applied.

Next, a fiber such as a nerve fiber running in the radiographing area is tracked on the basis of a diffusion tensor calculated from the magnetic resonance signal.

After the diffusion tensor is calculated as a symmetric matrix of 3 rows by 3 columns from the magnetic resonance signal obtained in the above execution of scanning, there are calculated a maximum eigen value of the diffusion tensor and a principal axis vector as an eigen vector corresponding to the maximum eigen value. Thereafter, on the basis of both the maximum eigen value and the principal axis vector, pixels corresponding to the fiber such as a nerve fiber running in the radiographing area are tracked by such a fiber tracking method as described above.

Next, in the tracked fiber, a diffusion tensor color map image is reconstructed so as to correspond to a curved surface including a tract which is extracted for example as a cone path.

Figure 5:
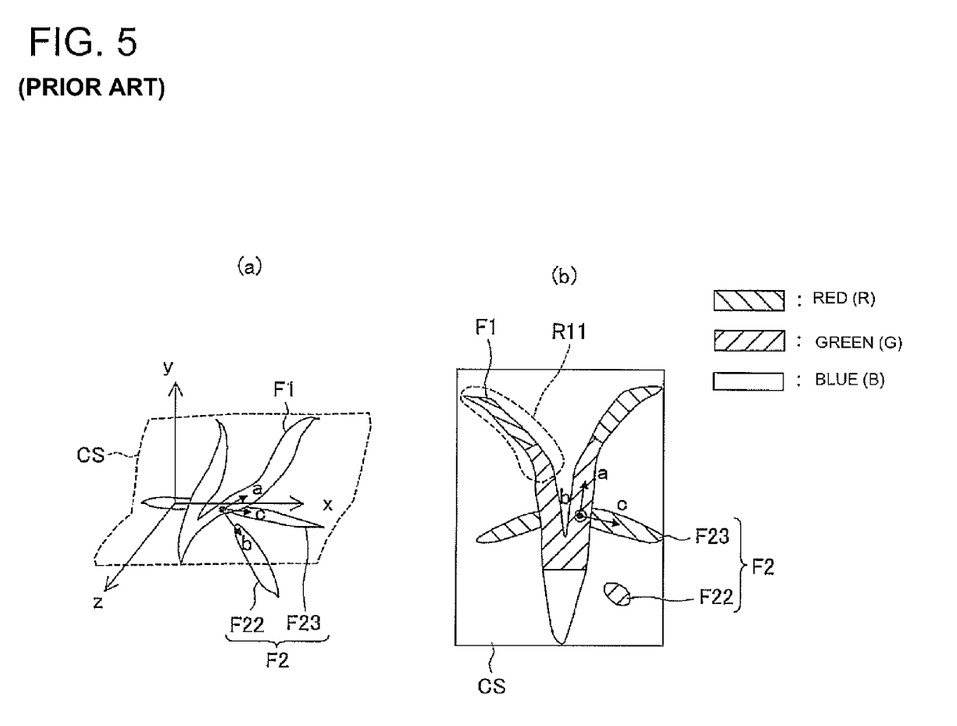
FIGS. 5(a) and 5(b) are diagrams showing an outline of a reconstructed diffusion tensor color map image.

FIG. 5 shows an outline of the reconstructed diffusion tensor color map image. In FIG. 5(a), fibers tracked in a radiographing space of a subject are shown schematically in terms of xyz coordinates. On the other hand, 5(b) shows an outline of the generated diffusion tensor color map image, in which, in the diffusion tensor color map image, the portion indicated in "red" color is hatched with left oblique lines as leftward inclined perpendiculars, the portion indicated in "green" color is hatched with right oblique lines as rightward inclined perpendiculars, and the portion indicated in "blue" color is a pattern-free portion.

As shown in FIGS. 5(a) and 5(b), three primary colors are allocated to pixels in according with fiber running directions so as to provide indication by "blue" when the fiber running direction is y direction, provide indication by "red" when the fiber running direction is z direction, and provide indication by "green" when the fiber running direction is x direction, in a curved surface CS in which the diffusion tensor color map image is generated. The diffusion tensor color map image is reconstructed by thus making the pixels different in color.

That is, in generating the diffusion tensor color map image, as shown in the following expression A, components $e_{1x}$, $e_{1y}$ and $e_{1z}$ in an xyz coordinate system of a magnet are determined from a principal axis vector e1 and three primary colors, i.e., RGB, are allocated to those components $e_{1x}$, $e_{1y}$ and $e_{1z}$:

$$(R,G,B) = (e_{1x}, e_{1y}, e_{1z}) \tag{A}$$

Therefore, in the case where a tract meanders or runs while bending as in a region R11 indicated by a dotted line in FIG. 5(b), the pixels corresponding to a fiber F1 running as a tract include a portion displayed by plural different colors. When this diffusion tensor color map image is observed, there sometimes is a case where it is difficult to grasp the running direction of the tract exactly. Such an inconvenience may occur also when the head of a subject is inclined relative to the coordinate axis of the xyz coordinate system at the time of execution of scanning, thus making it difficult to improve the diagnostic efficiency.

SUMMARY OF THE INVENTION

It is desirable that the problems described previously are solved.

In one aspect of the invention there is provided a magnetic resonance imaging apparatus for generating an image in a radiographing area of a subject on the basis of a magnetic resonance signal produced in the radiographing area within a static magnetic field space, the magnetic resonance imaging apparatus including a fiber tracking device for tracking a running fiber in the radiographing area on the basis of a diffusion tensor calculated from the magnetic resonance signal and a diffusion tensor color map image generating device for generating as the image a diffusion tensor color map image so as to match a curved surface including a tract extracted in the fiber tracked by the fiber tracking device, wherein the diffusion tensor color map image generating device generates the diffusion tensor color map image in such a manner that, in the fiber tracked by the fiber tracking device, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

Preferably, the diffusion tensor color map image generating device generates the diffusion tensor color image in such a manner that, in the fiber tracked by the fiber tracking device, pixels corresponding to a first fiber running as the tract so as to match the curved surface, pixels corresponding to a second fiber running as a fiber other than the tact in a normal line direction of the curved surface, and pixels corresponding to a third fiber running as a fiber other than the tract in a direction orthogonal to the running directions of the first and second fibers, become different in color in accordance with the running directions of the fibers. Preferably, the diffusion tensor color map image generating device generates the diffusion tensor color map image by making the pixels that correspond to the first, second and third fibers respectively, correspond to three primary colors respectively. Preferably, the magnetic resonance imaging apparatus further comprises a display device for displaying the diffusion tensor color map image generated by the diffusion tensor color map image generating device.

In another aspect of the invention there is provided a magnetic resonance imaging method for generating an image related to a radiographing area of a subject on the basis of a magnetic resonance signal produced in the radiographing area within a static magnetic field space, the magnetic resonance imaging method including a first step of tracking a fiber running in the radiographing area on the basis of a diffusion tensor calculated from the magnetic resonance signal and a second step of generating as the image a diffusion tensor color map image so as to match a curved surface including a tract extracted in the fiber tracked in the first step, wherein in the second step the diffusion tensor color map image is generated in such a manner that, in the fiber tracked in the first step, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

Preferably, in the second step the diffusion tensor color map image is generated in such a manner that, in the fiber tracked in the first step, pixels corresponding to a first fiber running as the tract so as to match the curved surface, pixels corresponding to a second fiber running as a fiber other than the tract in a normal line direction of the curved surface, and pixels corresponding to a third fiber running as a fiber other than the tract in a direction orthogonal to the running directions of the first and second fibers, become different in color in accordance with the running directions of the fibers. Preferably, in the second step the diffusion tensor color map image is generated by making the pixels that correspond to the first, second and third fibers respectively, correspond to three primary colors respectively. Preferably, the magnetic resonance imaging method further comprises a third step of displaying the diffusion tensor color map image generated in the second step.

In a further aspect of the invention there is provided a diffusion color map image generating apparatus including a fiber tracking device for tracking a running fiber in a radiographing area of a subject on the basis of a diffusion tensor calculated from a magnetic resonance signal produced in the radiographing area within a static magnetic field space and a diffusion tensor color map image generating device for generating a diffusion tensor color map image so as to match a curved surface including a tract extracted in the fiber tracked by the fiber tracking device, wherein the diffusion tensor color map image generating device generates the diffusion tensor color map image in such a manner that, in the fiber tracked by the fiber tracking device, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

Preferably, the diffusion tensor color map image generating device generates the diffusion tensor color map image in such a manner that, in the fiber tracked by the fiber tracking device, pixels corresponding to a first fiber running as the tract so as to match the curved surface, pixels corresponding to a second fiber running as a fiber other than the tract in a normal line direction of the curved surface, and pixels corresponding to a third fiber running as a fiber other than the tract in a direction orthogonal to the running directions of the first and second fibers, become different in color in accordance with the running directions of the fibers. Preferably, the diffusion tensor color map image generating device generates the diffusion tensor color map image by making the pixels that correspond to the first, second and third fibers respectively, correspond to three primary colors respectively. Preferably, the diffusion tensor color map image generating apparatus further comprises a display device for displaying the diffusion tensor color map image generated by the tensor color map image generating device.

For achieving the foregoing object, in a still further aspect of the invention there is provided a diffusion tensor color map generating method including a first step of tracking a fiber running in a radiographing area of a subject on the basis of a diffusion tensor calculated from a magnetic resonance signal produced in the radiographing area within a static magnetic field space and a second step of generating a diffusion tensor color map image so as to match a curved surface including a tract extracted in the fiber tracked in the first step, wherein in the second step the diffusion tensor color map image is generated in such a manner that, in the fiber tracked in the first step, pixels corresponding to the fiber running as the tract along the curved surface are made equal in color, and the pixels corresponding to the fiber running as the tract along the curved surface and pixels corresponding to a fiber running as a fiber other the tract in a direction different from the tract become different in color.

Preferably, in the second step the diffusion tensor color map image is generated in such a manner that, in the fiber tracked in the first step, pixels corresponding to a first fiber running as the tract so as to match the curved surface, pixels corresponding to a second fiber runner as a fiber other than the tract in a normal line direction of the curved surface, and pixels corresponding to a third fiber running as a fiber other than the tract in a direction orthogonal to the running directions of the first and second fibers, become different in color in accordance with the running directions of the fibers. Preferably, in the second step the diffusion tensor color map image is generated by making the pixels that correspond to the first, second and third fibers respectively, correspond to three primary colors respectively. Preferably, the diffusion tensor color map image generating method further comprises a third step of displaying the diffusion tensor color map image generated in the second step.

Thus, according to the invention it is possible to provide a magnetic resonance imaging apparatus, a magnetic resonance imaging method, a diffusion tensor color map image generating apparatus and a diffusion tensor color map image generating method capable of grasping a fiber running direction easily and improving the diagnostic efficiency with respect to a diffusion tensor color map image.

Further objects and advantages of the present invention will be apparent from the following description of the preferred embodiments of the invention as illustrated in the accompanying drawings.

BRIEF DESCRIPTION OF THE DRAWINGS

FIGS. 4(a) to 4(d) are diagrams showing in what manner a color is set for each pixel in a diffusion tensor color map image according to the embodiment.

DETAILED DESCRIPTION OF THE INVENTION

An embodiment of the invention will be described hereinunder with reference to the drawings.

Figure 1:
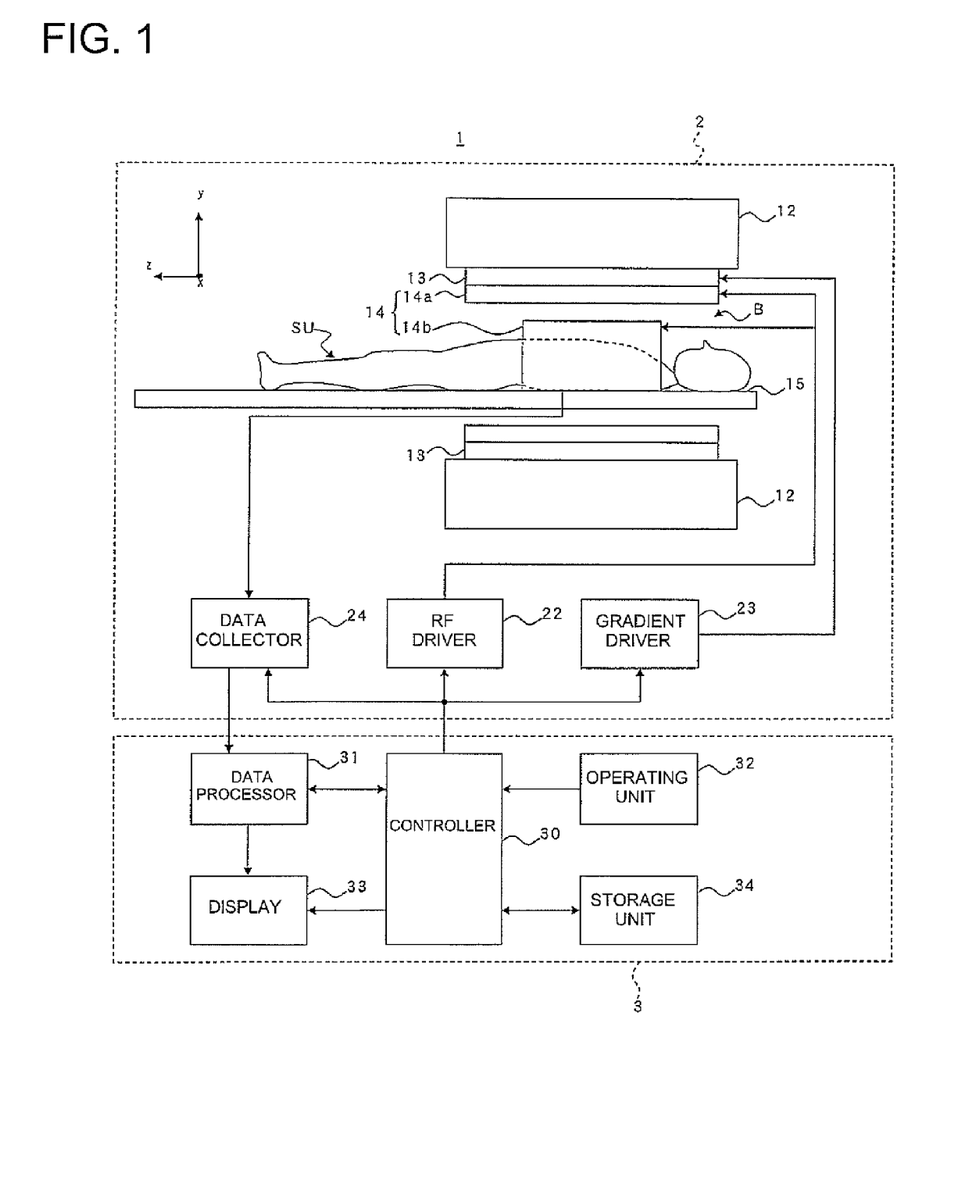
FIG. 1 is a configuration diagram showing the configuration of a magnetic resonance imaging apparatus 1 according to an embodiment of the invention.

(System Configuration) FIG. 1 is a configuration diagram showing the configuration of a magnetic resonance imaging apparatus 1 according to an embodiment of the invention.

As shown in FIG. 1, the magnetic resonance imaging apparatus 1 of this embodiment has a scanning section 2 and an operator console section 3. In a static magnetic field space the scanning section 2 transmits RF pulses to a radiographing area of a subject and scanning is performed to obtain a magnetic resonance signal produced in the radiographing area to which the RF pulses were transmitted. Thereafter, on the basis of the magnetic resonance signal obtained by the execution of scanning, the operator console section 3 generates an image related to the radiographing area.

The scanning section 2 will be described below.

As shown in FIG. 1, the scanning section 2 has a static magnetic field magnet 12, a gradient coil 13, an RF coil 14, a cradle 15, an RF driver 22, a gradient driver 23 and a data collector 24. Within an imaging space B with a static magnetic field formed therein, the scanning section 2 transmits RF pulses to a subject SU so as to excite spin of the subject and, by transmitting gradient pulses to the subject SU to which RF pulses were transmitted, the scanning section 2 performs scanning to obtain a magnetic resonance signal produced in the subject SU.

The components of the scanning section 2 will be described below one by one.

The static magnetic field magnet 12 is constituted for example by a superconducting magnet (not shown) and forms a static magnetic field in the image pickup space B in which the subject SU is accommodated. The static magnetic field magnet 12 forms a static magnetic field in a body axis direction (z direction) of the subject SU rested on the cradle 15. The static magnetic field magnet 12 may be constituted by a pair of permanent magnets.

The gradient coil 13 forms a gradient magnetic field in the image pickup space B with the static magnetic field formed therein and adds spatial position information to the magnetic resonance signal which the RF coil 14 receives. The gradient coil 13 is made up of three systems so as to correspond to mutually perpendicularly intersecting three-axis directions which are z direction running along the static magnetic field direction, x direction and y direction. These three systems transmit gradient pulses to the subject so as to form gradient magnetic fields in a frequency encoding direction, a phase encoding direction and a slice selecting direction respectively in accordance with image pickup conditions. More specifically, the gradient coil 13 applies a gradient magnetic field in a slice selecting direction of the subject SU to select a slice of the subject SU which is excited by the transmission of RF pulses from the RF coil 14. Moreover, the gradient coil 13 applies a gradient magnetic field in a phase encoding direction of the subject SU to phase-encode a magnetic resonance signal provided from the slice excited with RF pulses. Further, the gradient coil 13 applies a gradient magnetic field in a frequency encoding direction of the subject SU to frequency-encode the magnetic resonance signal provided from the slice excited with RF pulses.

Within the image pickup space B in which a static magnetic field is formed by the static magnetic field magnet 12, the RF coil 14 transmits RF pulses as an electromagnetic wave to the radiographing area of the subject SU to form a high frequency magnetic field and excite proton spins in the radiographing area. Further, the RF coil 14 receives as a magnetic resonance signal an electromagnetic wave generated from the excited protons in the radiographing area of the subject SU. In this embodiment, as shown in FIG. 1, the RF coil 14 comprises a first RF coil 14a and a second RR coil 14b. The first RF coil 14a is for example a bird cage type body coil, which is disposed so as to surround the radiographing area of the subject SU, and transmits RF pulses for example. On the other hand, the second RF coil 14b is a surface coil and receives a magnetic resonance signal for example.

The cradle 15 has a table for resting the subject SU. In accordance with a control signal provided from a controller 30 the cradle 15 moves the table between the interior and the exterior of the image pickup space B.

The RF driver 22 drives the RF coil 14 to transmit RF pulses into the image pickup space B, thereby forming a high frequency magnetic field in the image pickup space B. In accordance with a control signal provided from the controller 30 and with use of a gate modulator (not shown) the RF driver 22 modulates a signal provided from an RF oscillator (not shown) into a signal of a predetermined timing and a predetermined envelope. Thereafter, the signal modulated by the gate modulator is amplified by an RF power amplifier (not shown) and the amplified signal is outputted to the RF coil 14, which in turn outputs RF pulses.

In accordance with a control signal provided from the controller 30 the gradient driver 23 applies gradient pulses to the gradient coil 13 to drive the same coil, thereby causing a gradient magnetic field to be created within the image pickup space B in which a static magnetic field is formed. The gradient driver 23 has three systems of drive circuits (not shown) correspondingly to the gradient coil 13 of three systems.

In accordance with a control signal provided from the controller 30 the data collector 24 collects the magnetic resonance signal which the RF coil 14 receives. In the data collector 24, the phase of the magnetic resonance signal which the RF coil 14 receives is detected by a phase detector (not shown) using as a reference signal the output of the RF oscillator (not shown) in the RF driver 22. Thereafter, using an A/D converter (not shown), the magnetic resonance signal as an analog signal is converted to a digital signal, which is then outputted.

The following description is now provided about the operator console section 3.

As shown in FIG. 1, the operator console section 3 has the controller 30, a data processor 31, an operating unit 32, a display 33 and a storage unit 34.

The components of the operator console section 3 will be described below one by one.

The controller 30 has a computer and a memory which stores programs for causing the computer to execute predetermined data processings, and controls the components of the operator console section. In the illustrated example, operation data are inputted from the operating unit 32 to the controller 30, then on the basis of the operation data thus inputted the controller 30 outputs control signals to the RF driver 22, the gradient driver 23 and the data collector 24 respectively, causing each of them to execute a predetermined scanning operation. At the same time, the controller 30 outputs control signals to the data processor 31, the display 33 and the storage unit 34 respectively to control them.

The data processor 31 has a computer and a memory which stores programs for executing predetermined data processings with use of the computer. The data processor 31 carries out a data processing in accordance with a control signal provided from the controller 30. In the illustrated example, the data processor 31 uses as load data a magnetic resonance signal obtained upon execution of scanning by the scanning section 2 and generates an image related to the radiographing area of the subject SU. Then, the data processor 31 outputs the generated image to the display 33.

Figure 2:
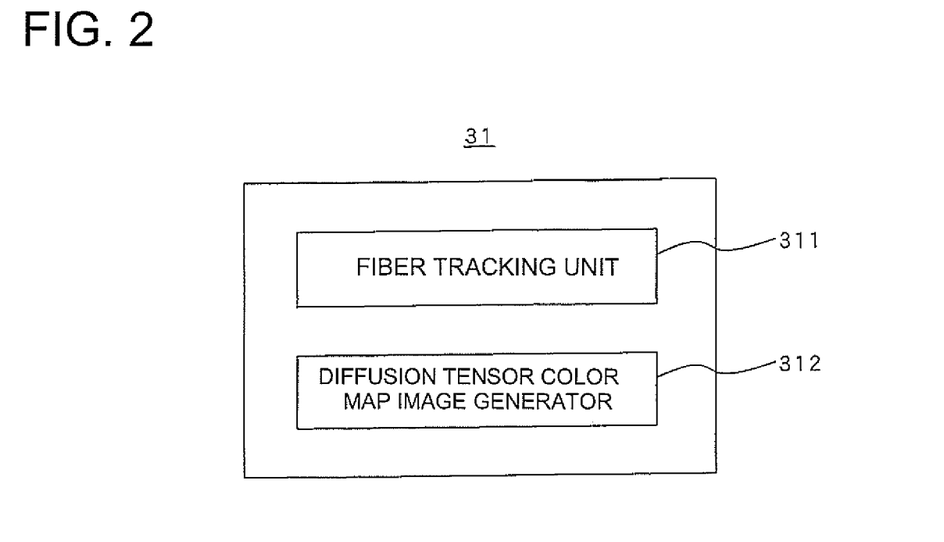
FIG. 2 is a block diagram showing a data processor 31 used in the embodiment.

FIG. 2 is a block diagram showing a principal portion of the data processor 31 in this embodiment.

As shown in FIG. 2, the data processor 31 has a fiber tracking unit 311 and a diffusion tensor color map image generator 312.

On the basis of a diffusion tensor calculated from a magnetic resonance signal which results from scanning for a three-dimensional radiographing area performed by the scanning section 2, the fiber tracking unit tracks a fiber such as a nerve fiber running in the three-dimensional radiographing area.

The diffusion tensor color map image generator 312 makes reformat so as to correspond to a curved surface which includes a tract extracted for example as a cone path in the fiber such as a nerve fiber tracked by the fiber tracking unit 311, thereby generating a diffusion tensor color map image.

In this embodiment, the diffusion tensor color map image generator 312 generates the diffusion tensor color map image in such a manner that, in the fiber tracked by the fiber tracking unit 311, pixels corresponding to a fiber running as an extracted tract along a curved surface including the tract and pixels corresponding to a fiber running as a fiber other than the tract in a direction different from the tract become different in color. That is, the diffusion tensor color map image generator 312 generates the diffusion tensor color map image in such a manner that, in the fiber tracked by the fiber tracking unit 311, pixels corresponding to a tract such as a cone path are made equal in color, and pixels corresponding to a fiber running as a fiber other than the tract such as a cone path in a direction different from the tract become different in color from the pixels corresponding to the tract.

Further, although the details will be described later, the diffusion tensor color map image generator 312 generates the diffusion tensor color map image in such a manner that, in the fiber tracked by the fiber tracking unit 311, pixels corresponding to a first fiber running as an extracted tract so as to correspond to a curved surface including the tract, a second fiber running as a fiber other than the tract in a normal line direction of the curved surface, and a third fiber running as a fiber other than the tract in a direction orthogonal to the running directions of the first and second fibers, become different in color in accordance with the running directions of the fibers. For example, the diffusion tensor color map image generator 312 generates the diffusion tensor color map image in such a manner that pixels corresponding to the first, second and third fibers correspond to three primary colors respectively. More specifically, three primary colors are allocated to the pixels in accordance with the running directions of the fibers so that pixels corresponding to the first fiber running as the tract along the curved surface are indicated by "blue," pixels corresponding to the second fiber running in a normal line direction of the curved surface are indicated by "green" and pixels corresponding to the third fiber running in a direction orthogonal to the running directions of the first and second fibers are indicated by "red." In this embodiment, the fiber or tract is an area resulting from fiber tracking, and in the diffusion tensor color map a color is determined depending on the direction of a principal axis vector of the diffusion tensor corresponding to each pixel. Even in the absence of a pixel on the fiber obtained, there is determined a color.

The operating unit 32 is constituted by operating devices such as a keyboard and a pointing device. Operation data are inputted by an operator to the operating unit 32, which in turn outputs the inputted operation data to the controller 30.

The display 33 is constituted by a display device such as a CRT and displays images on a display screen in accordance with a control signal provided from the controller 30. For example, the display 33 displays on the display screen a plurality of images on input items of operation data inputted to the operating unit 32 by the operator. Further, the display 33 receives from the data processor 31 data on an image of the subject SU which is produced on the basis of a magnetic resonance signal provided from the subject SU, and displays that image on the display screen. In this embodiment, the display 33 displays the diffusion tensor color map image generated by the diffusion tensor color map image generator 312.

The storage unit 34 is constituted by a memory and stores various data. The data stored in the storage unit 34 are accessed by the controller 30 as necessary.

(Operation) The following description is now provided about in what manner the magnetic resonance imaging apparatus 1 of this embodiment operates when generating a diffusion tensor color map image with respect to the radiographing area of the subject SU.

Figure 3:
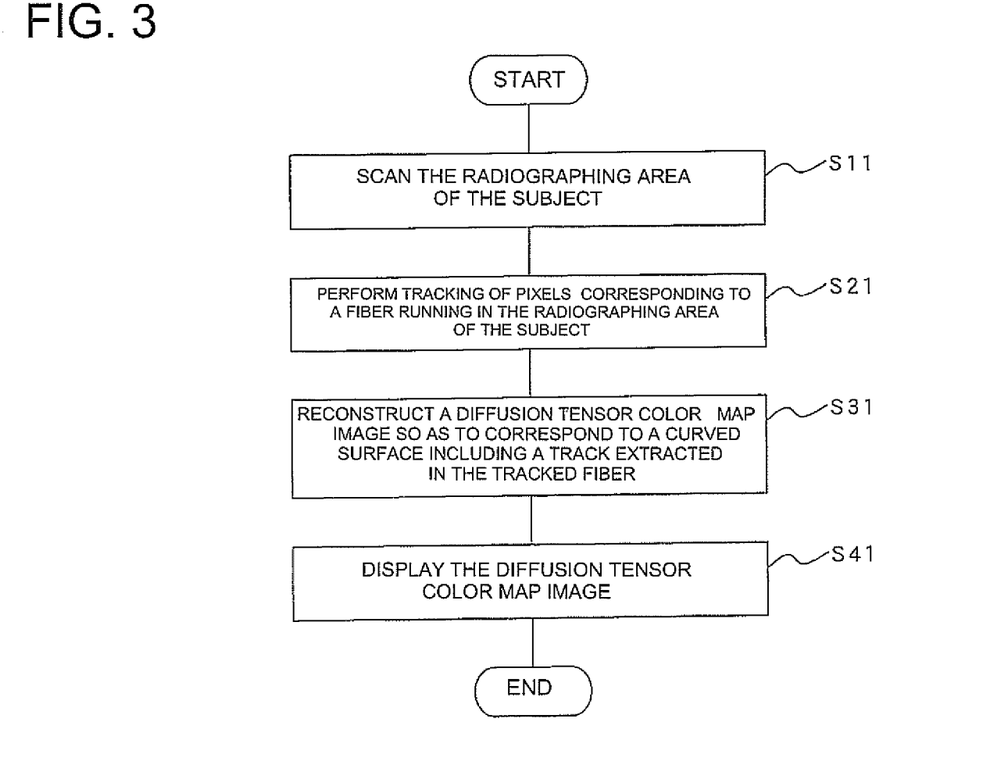
FIG. 3 is a flow chart showing operations for radiographing a radiographing area of a subject SU in the embodiment.

FIG. 3 is a flow chart showing diffusion tensor color map image generating operations in this embodiment.

For generating a diffusion tensor color map image, first the radiographing area of the subject is scanned as shown in FIG. 3 (S11).

In this step, for example like the brain of the subject, a three-dimensional area including a diffusion anisotropic structure is set as a radiographing area, then scanning is performed in a static magnetic field space with respect to the radiographing area and a magnetic resonance signal related to the radiographing area is collected.

In this embodiment, a slice to be radiographed in the radiographing area as a three-dimensional area and the number of slices are set, then scanning is performed for the radiographing area so as to make correspondence to a pulse sequence including MPGs of the same size in a sandwiching relation to for example the spin echo method, the MPGs being arranged symmetrically, e.g., in six directions, and a pulse sequence with such MPGs being not arranged. In this way there is collected a magnetic resonance signal for each slice so as to correspond to a layout combination of MPGs.

Next, as shown in FIG. 3, pixels corresponding to a fiber running in the radiographing area of the subject are tracked (S21).

In this step, the fiber tracking unit 311 tracks a fiber such as a nerve fiber running in the three-dimensional radiographing area on the basis of a diffusion tensor which is calculated from a magnetic resonance signal resulting from scanning for the three-dimensional radiographing area.

More particularly, first from the magnetic resonance signals resulting from the above scanning operation there are calculated diffusion tensors so as to correspond respectively to pixels as a symmetric matrix of 3 rows by 3 columns.

For example, in MPGs applied in six directions, the intensity Gi of MPG applied in i direction is represented by the following expression (1) and the intensity $S_i$ of an MR signal obtained is represented by the following expression (3) using a diffusion tensor D shown by the following expression (2). Therefore, when MPGs are applied in plural different directions, the following expression (4) is derived from the expressions (1) and (2). Thus, by solving the expression (4) it is possible to calculate the diffusion tensor D. In the following expressions, b stands for b value and So stands for a signal intensity of a T2 enhanced image at b=0.

$$G_i = (g_{xi}, g_{yi}, g_{zi}) \quad (1)$$

$$S_i = S_0 \cdot \exp(-b G_i^T D G_i) \quad (2)$$

$$D = \begin{pmatrix} D_{XX} & D_{XY} & D_{XZ} \\ D_{YX} & D_{YY} & D_{YZ} \\ D_{ZX} & D_{ZY} & D_{ZZ} \end{pmatrix} \quad (3)$$

$$\begin{bmatrix} \vdots & \vdots & \vdots & \vdots & \vdots & \vdots \\ \vdots & \vdots & \vdots & \vdots & \vdots & \vdots \\ g_{xi} & g_{yi} & g_{zi} & 2g_{xi}g_{yi} & 2g_{yi}g_{zi} & 2g_{zi}g_{xi} \\ \vdots & \vdots & \vdots & \vdots & \vdots & \vdots \\ \vdots & \vdots & \vdots & \vdots & \vdots & \vdots \\ \vdots & \vdots & \vdots & \vdots & \vdots & \vdots \end{bmatrix} \begin{bmatrix} D_{XX} \\ D_{YY} \\ D_{ZZ} \\ D_{XY} \\ D_{YZ} \\ D_{ZX} \end{bmatrix} = \begin{bmatrix} \vdots \\ \vdots \\ -\frac{1}{b} \log\left(\frac{S_1}{S_0}\right) \\ \vdots \\ \vdots \\ \vdots \end{bmatrix} \quad (4)$$

Then, with respect to the diffusion tensor determined as above there are calculated a maximum eigen value and a principal axis vector which is an eigen vector corresponding to the maximum eigen value.

Thereafter, on the basis of the thus-calculated maximum eigen value and principal axis vector, pixels corresponding to a fiber such as a nerve fiber running in the radiographing area are tracked by the fiber tracking method.

As described above, the maximum eigen value indicative of a maximum value in the eigen value of the diffusion tensor obtained represents the direction of a principal axis vector of a diffusion tensor ellipse, and in the diffusion of water molecules within the brain the direction of the principal axis vector and that of the fiber such as a nerve fiber become coincident with each other. Therefore, the fiber is tracked by utilizing both such maximum eigen value and principal axis vector.

More particularly, the display 33 displays an image generated using the diffusion tensor determined as above, for example, a uniformly dividable diffusion enhanced image or a fractional anisotropy image. Further, for example two areas each corresponding to a cone path on the displayed image are set as areas concerned. Thereafter, with the thus-set areas concerned as starting points and using information on a maximum eigen vector of the diffusion tensor in each pixel, the fiber is tracked to extract pixels corresponding to the fiber such as a nerve fiber.

Next, as shown in FIG. 3, a diffusion tensor color map image is reconstructed so as to correspond to a curved surface including a tract which is extracted in the tacked fiber (S31).

In this step, the diffusion tensor color map image generator 312 generates a diffusion tensor color map image by making reformat so as to correspond to a curved surface including a tract which is extracted for example as a cone path in the fiber such as a nerve fiber tracked as above.

More specifically, on the fiber extracted as above, for example a barycentric point on each slice is extracted as a corresponding point and a curved surface is determined so as to include the corresponding point on the tract. Then, an image is reformatted to the curved surface including the tract and the color of each pixel is set, thereby generating a diffusion tensor color map image.

Figure 4:
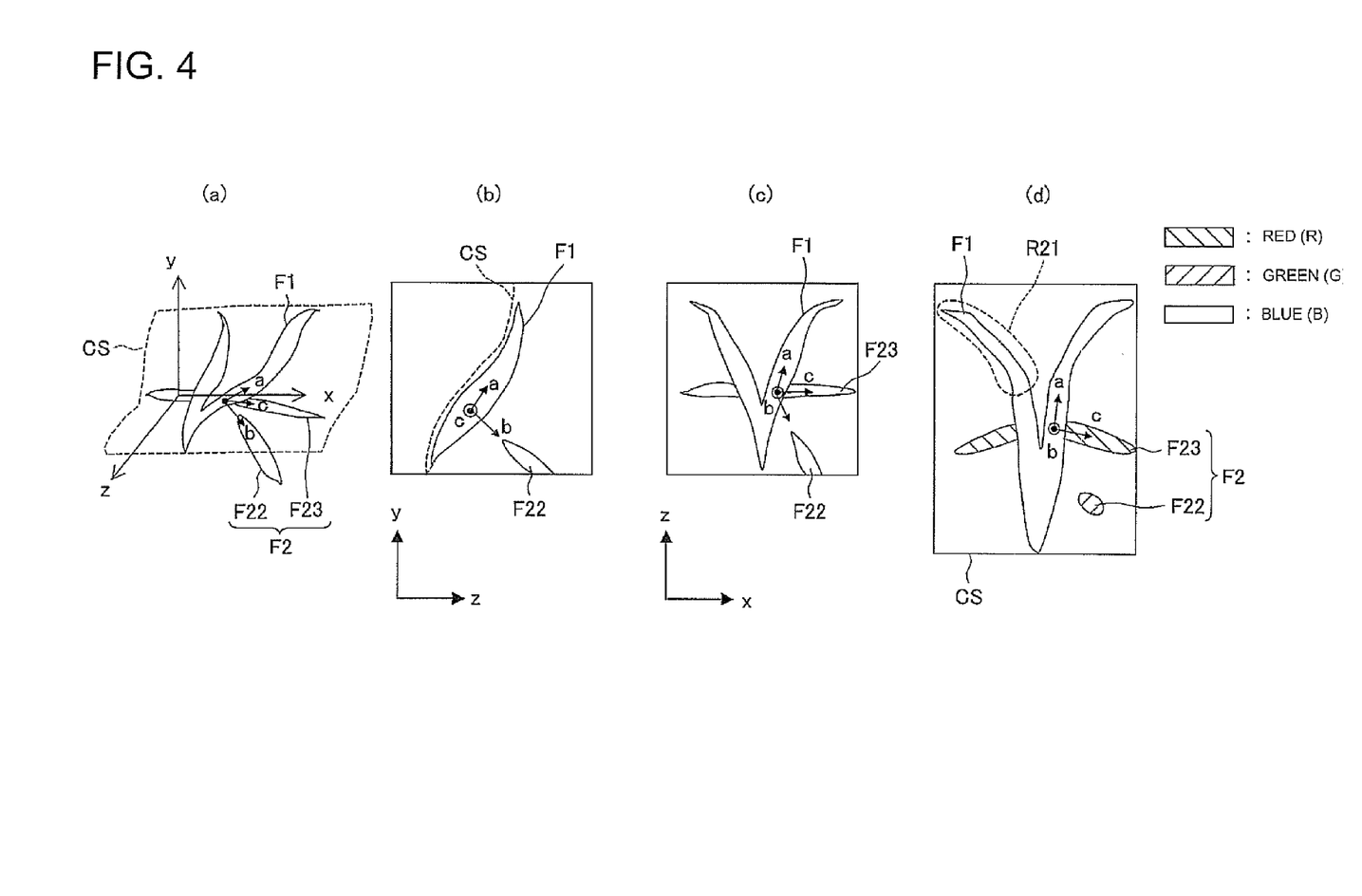

FIGS. 4(a) to 4(d) shows in what manner a color is set for each pixel in the diffusion tensor color map image according to this embodiment. FIG. 4(a) is a diagram showing fibers tracked in a radiographing space of the subject schematically in terms of xyz coordinates and FIG. 4 (b) is a diagram wherein the fibers shown in FIG. 4(a) are projected to the yz plane in the xyz coordinates. Further, FIG. 4(c) is a diagram wherein the fibers shown in FIG. 4(a) are projected to the xz plane in the xyz coordinates and FIG. 4(d) shows an outline of the generated diffusion tensor color map image. The diffusion tensor color map image of FIG. 4(d) is, in FIG. 4(a), a reformatted image to a curved surface CS which corresponds to a running direction "a" of a fiber F1 extracted as a tract and, in FIG. 4(b), it is a reformatted image to a curved surface CS which is defined by both the running direction "a" of the fiber F1 and a direction "c" perpendicular to the paper surface. In FIG. 4(d), the portion indicated by "red" is hatched with left oblique lines of a leftward inclined perpendicular, the portion indicated by "green" is hatched with right oblique lines of a rightward inclined perpendicular, and the portion indicated by "blue" is a pattern-free portion.

When setting a color for each pixel in the diffusion tensor color map image according to this embodiment, the same image is generated in such a manner that pixels wherein a principal axis vector of a diffusion tensor in each pixel faces a direction along a curved surface including a tract extracted in tracked fibers and pixels wherein a principal axis vector of diffusion tensor in each pixel faces a direction along a direction other than the tract running direction become different in color.

In other words, as shown in FIG. 4, the diffusion tensor color map image is generated in such a manner that pixels corresponding to the fiber F1 running as the tract along the curved surface which includes the tract extracted in the tracked fibers and pixels corresponding to the fiber F2 running as a fiber other than the tract along a direction other than the tract running direction become different in color. That is, as to the pixels corresponding to the first fiber F1 running as the tract such as a cone path in the tracked fibers as shown in FIGS. 4(*a*), 4(*b*) and 4(*c*), they are all made the same "blue" as in FIG. 4(*d*).

As to the pixels corresponding to the fiber F2 other than the tract such as a cone path in the radiographing area as a three-dimensional area defined by xyz coordinates as shown in FIGS. 4(*a*), 4(*b*) and 4(*c*), they are made different in color from the fiber F1 running as the tract as in FIG. 4(*d*).

More specifically, in connection with the fiber running as the fiber F2 other than the tract in the radiographing area as a three-dimensional area, the pixels corresponding to the second fiber F22 running in the direction "b" of a normal line of the curved surface CS along which the tract runs as shown in FIG. 4(*b*) are made "green" as in FIG. 4(*d*).

Further, in connection with the fiber running as the fiber F2 other than the tract in the radiographing area as a three-dimensional area, the pixels corresponding to the third fiber F23 running in the direction "c" orthogonal to both directions "a" and "b" as shown in FIG. 4(*c*), they are made "red" as in FIG. 4(*d*).

That is, three primary colors are allocated to pixels so that in diffusion tensors of pixels corresponding to a tract extracted in the radiographing area as a three-dimensional area, pixels corresponding to the first fiber F1 running along the curved surface CS including the tract are made "blue," pixels corresponding to the second fiber F22 running as a fiber other than the tract are made "red," and pixels corresponding to the third fiber F23 running as a fiber other than the tract are made "green," thereby generating a diffusion tensor color map image. For a thick fiber portion there is used a mean value in a local site. As to pixels corresponding to a fiber other than a tract and included in reformat surface, a color combination is made by using information on a vector field generated by interpolating an intra-tract vector field at the time of reformatting. For the interpolation there may be adopted the B-Spline method for example.

More specifically, as to pixels corresponding to the first fiber F1 shown in FIG. 4, when the positions $r_i$ of pixels (i=1, . . . , N) on tracked fibers are represented by the following expression (5) in xyz coordinates and the directions $e_1(r_i)$ of principal axis vectors of diffusion tensors on the images concerned are represented by the following expression (6), the direction $e_1'(r)$ of the first fiber F1 in an arbitrary position, r, is represented by the following expression (7) as a suitable linear combination of information on such known directions of principal axis vectors. The direction $e1'(r)$ of the first fibers F1 becomes a virtual principal axis direction.

$$r_1 = (x_1, y_1, z_1) \tag{5}$$
$$r_N = (x_N, y_N, z_N)$$

$$e_1(r_i) = e_1(r_1), \ldots e_1(r_N) \tag{6}$$

$$e_1'(r) = \sum_{i=1}^{N} a_i e_1(r_i) \tag{7}$$

As to a coefficient, ai, used in the expression (7), it can be determined by adopting, for example, such a conventional method as B-Spine method or radius vector basic function method.

Further, as shown in FIG. 4, directions $e_2'(r)$ and $e_3'(r)$ orthogonal to the above direction are also determined in the same way as above, as represented by the following expressions (8) and (9):

$$e_2'(r) = \sum_{i=1}^{N} b_i e_2(r_i) \tag{8}$$

$$e_3'(r) = \sum_{i=1}^{N} c_i e_3(r_i) \tag{9}$$

Therefore, when an actual diffusion principal axis vector at the position, r, is $e_1(r)$, projections $P_1(r)$, $P_2(r)$ and $P_3(r)$ of $e_1(r)$ in the directions of $e_1'(r1)$, $e_2'(r)$ and $e_3'(r)$ are represented by the following expressions (10), (11) and (12), respectively:

$$P_1(r) = \frac{e_1 \cdot e_1'}{e_1' \cdot e_1'} e_1' \tag{10}$$

$$P_2(r) = \frac{e_2 \cdot e_2'}{e_2' \cdot e_2'} e_2' \tag{11}$$

$$P_3(r) = \frac{e_3 \cdot e_3'}{e_3' \cdot e_3'} e_3' \tag{12}$$

Therefore, using this result, the three primary colors of RGB are allocated to the pixels as shown in the following expression (13). That is, the distribution of the colors is determined depending on the components x, y and z of P1(*r*). More particularly, in the case where the principal axis of the diffusion tensor at the position, r, is parallel to $e_1'$, $P_1(r)=1$, $P_2(r)=0$, $P_3(r)=0$, so that the pixels are indicated by red. Likewise, in case of the principal axis being parallel to $e_2'$, $P_1(r)=0$, $P_2(r)=1$, $P_3(r)=0$, so that the pixels are indicated by green. Consequently, the pixels corresponding to the first fiber are indicated by "blue" (B) alone.

$$(R,G,B)=(p_{1x},p_{1y},p_{1z}) \tag{13}$$

In the second fiber F2, also as to the pixels corresponding to the fiber F22 running in the normal line direction "b" of the foregoing curved surface, a color is set in the same way as above. In this case, information on this fiber is added to the vector field interpolation.

Further, in the second fiber F2, also as to the pixels corresponding to the fiber F23 running in the direction "c" orthogonal to both directions "a" and "b," a color is set in the same way as above.

Next, as shown in FIG. 3, the diffusion tensor color map image is displayed (S41).

In this step, the display 33 displays the diffusion tensor color map image generated by the diffusion tensor color map image generator 312.

In this embodiment, as described above, a diffusion tensor color map image is generated in such a manner that pixels corresponding to a fiber running as a tract along a curved surface including the tract which is extracted in a tracked fiber are made equal in color, and the pixels corresponding to the fiber running as the tract and pixels corresponding to a fiber running as a fiber other than the tract along a direction other than the curved surface are made different in color. Therefore, as shown in the area R21 indicated by a dotted line in FIG. 4(*d*), even when a tract meanders or is running while bending, the pixels along the tract running direction are displayed in the same color, so that when observing this diffusion tensor color map image, it is easy to grasp the running direction of the tract. Thus, according to this embodiment it is easy to grasp the fiber running direction in the diffusion tensor color map image and hence it is possible to improve the diagnostic efficiency.

In the above embodiment, the magnetic resonance imaging apparatus 1 corresponds to the magnetic resonance imaging apparatus defined in the invention, the display 33 corresponds to the display section defined in the invention, the fiber tracking unit 311 corresponds to the fiber tracking section defined in the invention, and the diffusion tensor color map image generator 312 corresponds to the diffusion tensor color map image generating section defined in the invention.

In practicing the invention, no limitation is made to the above embodiment, but various modifications may be adopted.

For example, there may be adopted a modification wherein as to pixels spaced far away beyond a predetermined distance from a tract, three primary colors are allocated to them so as to correspond to a magnet coordinate system, while as to nearby pixels spaced within the predetermined distance from the tract, the distribution of colors may be determined by the interpolation method. Moreover, even when the number of fiber tracked and extracted by the fiber tracking method is only one, a reformatting curved surface may be constituted from a point on a tract or there may be adopted a configuration wherein a thick tract direction is one surface direction.

Additionally, a diffusion tensor color map image may be generated in such a manner that, in tracked fibers, as to pixels corresponding to a fiber extracted as a tract, they may be made the same color using one (e.g., blue) of the three primary colors of red, green and blue, while as to pixels corresponding to any other fiber, as in the prior art, the three primary colors are allocated to the pixels so as to correspond to a magnetic coordinate system and a display is made in a state of additive mixture of color stimuli.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus for generating an image related to a radiographing area of a subject on the basis of a magnetic resonance signal produced in the radiographing area within a static magnetic field space, the magnetic resonance imaging apparatus comprising:
   a fiber tracking device for tracking a running fiber in the radiographing area on the basis of a diffusion tensor calculated from the magnetic resonance signal; and
   a diffusion tensor color map image generating device for generating as said image a diffusion tensor color map image so as to match a curved surface including a tract extracted in the fiber tracked by the fiber tracking device,
   wherein the diffusion tensor color map image generating device generates the diffusion tensor color map image in such a manner that, in the fiber tracked by the fiber tracking device, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

2. A magnetic resonance imaging apparatus according to claim 1, wherein the diffusion tensor color map image generating device generates the diffusion tensor color map image in such a manner that, in the fiber tracked by the fiber tracking device, pixels corresponding to a first fiber running as the tract so as to match the curved surface, pixels corresponding to a second fiber running as a fiber other than the tract in a normal line direction of the curved surface, and pixels corresponding to a third fiber running as a fiber other than the tract in a direction orthogonal to the running directions of the first and second fibers, become different in color in accordance with the running directions of the fibers.

3. A magnetic resonance imaging apparatus according to claim 2, wherein the diffusion tensor color map image generating device generates the diffusion tensor color map image by making the pixels that corresponds to the first, second and third fibers respectively, correspond to three primary colors respectively.

4. A magnetic resonance imaging apparatus according to claim 1, further comprising a display device for displaying the diffusion tensor color map image generated by the diffusion tensor color map image generating device.

5. A magnetic resonance imaging apparatus according to claim 2, further comprising a display device for displaying the diffusion tensor color map image generated by the diffusion tensor color map image generating device.

6. A magnetic resonance imaging apparatus according to claim 3, further comprising a display device for displaying the diffusion tensor color map image generated by the diffusion tensor color map image generating device.

7. A magnetic resonance imaging method for generating an image related to a radiographing area of a subject on the basis of a magnetic resonance signal produced in the radiographing area within a static magnetic field space, the magnetic resonance imaging method comprising:
   a first step of tracking a fiber running in the radiographing area on the basis of a diffusion tensor calculated from the magnetic resonance signal; and
   a second step of generating as said image a diffusion tensor color map image so as to match a curved surface including a tract extracted in the fiber tracked in the first step,
   wherein in the second step the diffusion tensor color map image is generated in such a manner that, in the fiber tracked in the first step, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

8. A magnetic resonance imaging method according to claim 7, wherein in the second step the diffusion tensor color map image is generated in such a manner that, in the fiber tracked in the first step, pixels corresponding to a first fiber running as the tract so as to match the curved surface, pixels corresponding to a second fiber running as a fiber other than the tract in a normal line direction of the curved surface, and pixels corresponding to a third fiber running as a fiber other than the tract in a direction orthogonal to the running directions of the first and second fibers, become different in color in accordance with the running directions of the fibers.

9. A magnetic resonance imaging method according to claim 8, wherein in the second step the diffusion tensor color map image is generated by making the pixels that correspond to the first, second and third fibers respectively, correspond to three primary colors respectively.

10. A magnetic resonance imaging method according to claim 7, further comprising a third step of displaying the diffusion tensor color map image generated in the second step.

11. A magnetic resonance imaging method according to claim 8, further comprising a third step of displaying the diffusion tensor color map image generated in the second step.

12. A magnetic resonance imaging method according to claim 9, further comprising a third step of displaying the diffusion tensor color map image generated in the second step.

13. A diffusion tensor color map image generating apparatus comprising:
- a fiber tracking device for tracking a running fiber in a radiographing area of a subject on the basis of a diffusion tensor calculated from a magnetic resonance signal produced in the radiographing area within a static magnetic field space; and
- a diffusion tensor color map image generating device for generating a diffusion tensor color map image so as to match a curved surface including a tract extracted in the fiber tracked by the fiber tracking device,
- wherein the diffusion tensor color map image generating device generates the diffusion tensor color map image in such a manner that, in the fiber tracked by the fiber tracking device, pixels corresponding to the fiber running as the tract along the curved surface are made equal in color, and the pixels corresponding to the fiber running as the tract along the curved surface and pixels corresponding to a fiber running as a fiber other than the tract in a direction different from the tract become different in color.

14. A diffusion tensor color map image generating apparatus according to claim 13, wherein the diffusion tensor color map image generating device generates the diffusion tensor color map image in such a manner that, in the fiber tracked by the fiber tracking device, pixels corresponding to a first fiber running as the tract so as to match the curved surface, pixels corresponding to a second fiber running as a fiber other than the tract in a normal line direction of the curved surface, and pixels corresponding to a third fiber running as a fiber other than the tract in a direction orthogonal to the running directions of the first and second fibers, become different in color in accordance with the running directions of the fibers.

15. A diffusion tensor color map image generating apparatus according to claim 14, wherein the diffusion tensor color map image generating device generates the diffusion tensor color map image by making the pixels that correspond to the first, second and third fibers respectively, correspond to three primary colors respectively.

16. A diffusion tensor color map image generating apparatus according to claim 13, further comprising a display device for displaying the diffusion tensor color map image generated by the diffusion tensor color map image generating device.

17. A diffusion tensor color map image generating apparatus according to claim 14, further comprising a display device for displaying the diffusion tensor color map image generated by the diffusion tensor color map image generating device.

18. A diffusion tensor color map image generating apparatus according to claim 15, further comprising a display device for displaying the diffusion tensor color map image generated by the diffusion tensor color map image generating device.

* * * * *